(12) United States Patent
Sakurada et al.

(10) Patent No.: US 7,323,048 B2
(45) Date of Patent: Jan. 29, 2008

(54) METHOD FOR PRODUCING A SINGLE CRYSTAL AND A SINGLE CRYSTAL

(75) Inventors: Masahiro Sakurada, Fukushima (JP); Makoto Iida, Fukushima (JP); Nobuaki Mitamura, Fukushima (JP); Atsushi Ozaki, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 28 days.

(21) Appl. No.: 10/561,205

(22) PCT Filed: May 28, 2004

(86) PCT No.: PCT/JP2004/007349

§ 371 (c)(1),
(2), (4) Date: Feb. 3, 2006

(87) PCT Pub. No.: WO2005/001170

PCT Pub. Date: Jan. 6, 2005

(65) Prior Publication Data

US 2006/0130740 A1    Jun. 22, 2006

(30) Foreign Application Priority Data

Jun. 27, 2003   (JP) .............................. 2003-185960

(51) Int. Cl.
*C30B 15/20*   (2006.01)
(52) U.S. Cl. .............................. 117/20; 117/13; 117/15; 117/19

(58) Field of Classification Search .................. 117/13, 117/15, 19, 20
See application file for complete search history.

(56) References Cited

U.S. PATENT DOCUMENTS 5,919,302 A    7/1999   Falster et al.
6,482,260 B2 *  11/2002   Sakurada et al. ............. 117/20

FOREIGN PATENT DOCUMENTS

| JP | A 11-147786 | 6/1999 |
|---|---|---|
| JP | A 2000-313691 | 11/2000 |
| JP | A 2002-057160 | 2/2002 |

OTHER PUBLICATIONS

Voronkov, "The Mechanism of Swirl Defects Formation in Silicon," Journal of Crystal Growth, vol. 59, pp. 625-643, 1982.
Dupret et al., "Global Modelling of Heat Transfer in Crystal Growth Furnaces," Int. J. Heat Mass Transfer, vol. 33, No. 9, pp. 1849-1871, 1990.

* cited by examiner

*Primary Examiner*—Felisa Hiteshew
(74) *Attorney, Agent, or Firm*—Oliff & Berridge PLC

(57) ABSTRACT

A method for producing a single crystal in which when the single crystal is grown by Czochralski method, V/G is controlled by controlling a fluctuation of a temperature gradient G of the crystal which is being pulled without lowering a pulling rate V, thereby the single crystal including a desired defect region over a whole plane in a radial direction of the crystal entirely in a direction of the crystal growth axis can be produced effectively for a short time at a high yield.

40 Claims, 5 Drawing Sheets a distance L between a surface of a raw material melt and a heat insulating member (mm)

METHOD FOR PRODUCING A SINGLE CRYSTAL AND A SINGLE CRYSTAL

This application is a 371 of PCT/JP04/07349 May 28, 2004.

TECHNICAL FIELD

The present invention relates to a method for producing a single crystal by Czochralski Method, more particularly, to a method for producing a single crystal including a desired defect region.

BACKGROUND TECHNOLOGY

A single crystal used as a substrate of semiconductor devices is, for example, a silicon single crystal. It is mainly produced by Czochralski Method (referred to as CZ method for short hereafter). In recent years, semiconductor devices have come to be integrated higher and devices have come to be decreased in size. Along with that, a problem of Grown-in defects introduced during growth of a single crystal has become more important.

Hereafter, Grown-in defects will be explained with reference to FIG. 6.

Generally, in the case of growing a silicon single crystal, when a growth rate V of the crystal (a pulling rate of the crystal) is relatively high, there exist Grown-in defects such as FPD (Flow Pattern Defect) and COP (Crystal Originated Particle), which are considered due to voids consisting of agglomerated vacancy-type point defects, at a high density over the entire radial direction of the crystal. The region containing these defects due to voids is referred to as V (Vacancy) region.

Furthermore, when the growth rate of the crystal is lowered, along with lowering of the growth rate, an OSF (Oxidation Induced Stacking Fault) region is generated from the periphery of the crystal in a ring shape. When the growth rate is further lowered, the OSF ring shrinks to the center of the wafer and disappears. When the growth rate is further lowered, there exist defects such as LSEPD (Large Secco Etch Pit Defect) and LFPD (Large Flow Pattern Defect), which are considered due to dislocation loops consisting of agglomerated interstitial silicon atoms, at a low density. The region where these defects exist is referred to as I (Interstitial) region.

In recent years, a region containing no defects like FPD and COP due to voids as well as no defects like LSEPD and LFPD due to interstitial silicon atoms has been found between the V region and the I region and also outside the OSF ring. This region is referred to as N (Neutral) region. In addition, it has been found that when further classifying the N region, there exist Nv region (the region where a lot of vacancies exist) adjacent to the outside of the OSF ring and Ni region (the region where a lot of interstitial silicon atoms exist) adjacent to the I region, and that when performing thermal oxidation treatment, a lot of oxide precipitates are generated in the Nv region and little oxide precipitates are generated in the Ni region.

Furthermore, it has been found that, after performing the thermal oxidation treatment, there exist a region where defects detected by Cu deposition treatment are particularly generated (hereinafter referred to as Cu deposition defect region) in a portion of the Nv region where oxygen precipitation tends to be generated, and the Cu deposition defect region causes degradation of electric property like oxide dielectric breakdown voltage characteristics.

It is considered that introduction amount of these Grown-in defects is determined by a parameter of V/G ($mm^2/°C.·min$) which is a ratio of a pulling rate V (mm/min) when a single crystal is grown and a temperature gradient G (° C./mm) of the crystal in the direction of pulling axis from melting point of silicon to 1400° C. at the vicinity of solid-liquid interface (for example, see V. V. Voronkov, Journal of Crystal Growth, 59 (1982), 625-643). Therefore, a single crystal is grown with controlling V/G to be a determined value constantly, and thus a single crystal including a desired defect region or a desired defect-free region can be produced.

For example, in Japanese Patent Laid-open (Kokai) No. H11-147786, it is disclosed that, when a silicon single crystal is grown, the single crystal is pulled with controlling V/G in a determined range (for example, $0.112$-$0.142$ $mm^2/°C.·min$) at the center of the crystal, and thus a silicon single crystal wafer without defects due to voids and defects due to dislocation loops can be obtained. Furthermore, in recent years, the demand for a defect-free crystal of N region without Cu deposition defect region has become higher. And it has been demanded a production of a single crystal in which the single crystal is pulled with controlling V/G to be a desired defect-free region with high precision.

Generally, temperature gradient G of a crystal in a direction of a pulling axis is considered to be determined only by HZ (hot zone: a furnace structure) of an apparatus for pulling a single crystal in which a single crystal is grown. However, it is extremely difficult to change HZ while pulling a single crystal. Therefore, when a single crystal is grown with controlling V/G as described above, the temperature gradient G of the crystal isn't controlled during pulling the single crystal. However, V/G is controlled by adjusting the pulling rate V to produce a single crystal including a desired defect region.

In addition, it has been known that the temperature gradient G of the crystal generally tends to lower as a single crystal grows, and thus G becomes smaller at the end of growing the straight body of the single crystal than at the start of growing the straight body of the single crystal. Therefore, in order to control V/G to be a desired value almost constantly, as the single crystal grows, a pulling rate V has to be changed to a lower rate according to fluctuation (decline) of the temperature gradient G of the crystal. As a result of that, time for growing a straight body of a single crystal lengthens, and thus there is a problem that productivity is lowered.

Furthermore, the pulling rate at the end of growing a straight body of a single crystal influences a pulling rate and a pulling time of the single crystal at the subsequent tailing process to form a tail of the single crystal. Therefore, if the pulling rate is lowered at the end of growing the straight body as described above, the pulling rate at the tailing process is also lowered and the pulling time is further drawn out. Accordingly, there is a problem that productivity in producing a single crystal is extremely lowered and it leads to raise of production cost.

Furthermore, conventionally, even if a single crystal is grown with adjusting the pulling rate V to control V/G to be a determined value as described above, when defect regions spreading in a radial direction of the single crystal obtained actually are examined at respective portions of the single crystal, there are cases that a desired defect region isn't distributed over a whole plane in the radial direction in a partial range in a direction of the crystal growth axis. Accordingly, there are cases that a single crystal can't be grown with stability so that a desired defect region is distributed over a whole plane in the radial direction entirely in the direction of the crystal growth axis.

For example, in order to produce a single crystal of which a whole plane in a radial direction is N region, a pulling rate V is determined at the start of growing a straight body of the single crystal so that V/G becomes a determined value, and the single crystal is grown with controlling V/G to be constant at a determined value by gradually lowering the pulling rate V along with fluctuation of the temperature gradient G of the crystal during the growth of the single crystal. Even in this case, a whole plane in the radial direction of the former half of the straight body of the single crystal is N region, however, OSF region or V region is observed, or I region is observed in a portion of a plane in the radial direction of the middle portion or the latter half of the straight body of the single crystal. Thus, there are some cases that the whole plane in the radial direction is not N region.

Moreover in the conventional production of a single crystal, a pulling rate of a single crystal is also used as one of parameters to control a diameter of a single crystal to be grown. Therefore, in the case of growing a single crystal of a desired defect region as described above, V/G has to be controlled by adjusting a pulling rate, and also a diameter of the single crystal has to be controlled. Accordingly, for example, when control of V/G and control of a diameter of a single crystal are performed during pulling the single crystal, in the case of wishing to change the pulling rate according to different conditions with each other between the controls, only either control can be performed. As a result of that, a diameter of the single crystal changes excessively during pulling the single crystal or crystal quality like a defect region deviates from a desired region, and which leads to considerable decrease of yield.

DISCLOSURE OF THE INVENTION

The present invention was accomplished in view of the aforementioned circumstances, and its object is to provide a method for producing a single crystal in which when the single crystal is grown by CZ method, V/G is controlled by controlling fluctuation of a temperature gradient G of the crystal which is being pulled without lowering a pulling rate V, thereby the single crystal including a desired defect region over a whole plane in a radial direction of the crystal entirely in a direction of the crystal growth axis can be produced effectively for a short time at high yield.

The present invention was accomplished to achieve the aforementioned object, and there is provided a method for producing a single crystal with pulling the single crystal from a raw material melt in a chamber by Czochralski method, wherein when growing the single crystal, where a pulling rate is defined as V (mm/min), a temperature gradient of the crystal at the vicinity of solid-liquid interface at a central portion of the crystal is defined as Gc (° C./mm), and a temperature gradient of the crystal at the vicinity of solid-liquid interface at a peripheral portion of the crystal is defined as Ge (° C./mm) during growing a straight body of the single crystal, the temperature gradient Gc of the crystal at the central portion of the crystal and the temperature gradient Ge of the crystal at the peripheral portion of the crystal are controlled by changing a distance between a melt surface of the raw material melt and a heat insulating member provided in the chamber so as to oppose to the surface of the raw material melt, thereby $\Delta G = |(Gc-Ge)|$ which is difference between the temperature gradient Gc at the central portion of the crystal and the temperature gradient Ge at the peripheral portion of the crystal is 0.5° C./mm or less, and also V/Gc ($mm^2$/° C.·min) which is a ratio of the pulling rate V and the temperature gradient Gc at the central portion of the crystal is controlled so that a single crystal including a desired defect region is grown.

As described above, when a single crystal is grown by CZ method, by changing a distance between the surface of the raw material melt and a heat insulating member, the temperature gradient Gc at the central portion of the crystal and the temperature gradient Ge at the peripheral portion of the crystal can be controlled. Thereby, $\Delta G$ can be made 0.5° C./mm or less during pulling the single crystal, and also V/Gc can be controlled at a desired value without lowering a pulling rate V. Thus, a single crystal with high quality in which a desired defect region is distributed uniformly over a whole plane in the radial direction entirely in the direction of the crystal growth axis can be produced effectively for a short time. And if the single crystal with high quality including a desired defect region can be produced effectively as described above, productivity in production of a single crystal can be improved and cost can be reduced considerably. Furthermore, if V/Gc is controlled by changing the distance between the melt surface and the heat insulating member as described above, V/Gc can be controlled with high precision and also a diameter of the single crystal can be controlled by the pulling rate with stability with high precision. Thereby, a single crystal with very high quality including a desired crystal quality and a desired diameter of the crystal can be produced with stability at high yield.

At this time, the single crystal is pulled with keeping the pulling rate V constant.

According to the method for producing a single crystal of the present invention, the temperature gradient Gc at the central portion of the crystal and the temperature gradient Ge at the peripheral portion of the crystal can be controlled by changing a distance between the melt surface and the heat insulating member as described above. Thereby, even if a single crystal is pulled with keeping a pulling rate V constant, V/Gc can be controlled easily so that a single crystal including a desired defect region is grown. Accordingly, with keeping the pulling rate V high and constant, a single crystal including a uniform defect region entirely in the direction of the crystal growth axis can be pulled easily. In addition, keeping the pulling rate V constant in the present invention means that each average pulling rate at respective portions of the straight body of the single crystal is kept constant. If each average pulling rate at respective portions of the single crystal is kept constant, in order to control a diameter of the single crystal to be a predetermined value with high precision, V can be changed in a predetermined range around the average pulling rate at respective portions of the crystal.

In these cases, it is preferable that V/Gc is controlled so that the defect region of the single crystal to be grown is N region over a whole plane in a radial direction.

As described above, by controlling V/Gc so that the defect region of the single crystal is N region over a whole plane in the radial direction during pulling the single crystal, the single crystal with very high quality containing no defects like FPD and COP due to voids as well as no defects like LSEPD and LFPD due to dislocation loops can be produced at a high level of productivity and at high yield.

Furthermore, according to the method for producing a single crystal of the present invention, it is possible that the distance between the surface of the raw material melt and the heat insulating member is changed by adjusting an elevation rate of a crucible containing the raw material melt to move a level of the raw material melt up and down and/or by moving a position of the heat insulating member up and down.

In the present invention, during growing a single crystal, the distance between the surface of the raw material melt and the heat insulating member can be changed with ease and with high precision by adjusting an elevation rate of a crucible containing the raw material melt to move a level of the raw material melt up and down and/or by moving a position of the heat insulating member up and down. Thereby, ΔG can be surely made 0.5° C./mm or less during pulling the single crystal, and also V/Gc can be controlled with high precision to be a desired value.

In these cases, it is preferable that the distance between the surface of the raw material melt and the heat insulating member is 30 mm or more.

As described above, if the distance between the surface of the raw material melt and the heat insulating member is 30 mm or more, ΔG can be easily made 0.5° C./mm or less during pulling the crystal. Thereby, a single crystal in which a desired defect region is distributed uniformly over a whole plane in the radial direction can be produced at high stability.

Furthermore, in the present invention, it is preferable that the distance between the surface of the raw material melt and the heat insulating member is changed automatically according to a changing condition obtained by performing an experiment beforehand.

As described above, when the temperature gradient Gc at the central portion of the crystal and the temperature gradient Ge at the peripheral portion of the crystal are controlled by changing a distance between the melt surface and the heat insulating member, each relation between a distance between the melt surface and the heat insulating member at production environment in which a single crystal is practically produced and the temperature gradients Gc and Ge of the crystal are examined by performing an experiment like simulation analysis or practical production beforehand. And based on thus-obtained data, a changing condition that changes the distance between the melt surface and the heat insulating member is obtained. Then, the distance between the melt surface and the heat insulating member is changed automatically according to thus-obtained changing condition during pulling the single crystal. Thereby, the temperature gradients Gc and Ge of the crystal can be controlled automatically with high precision to make surely ΔG at 0.5° C./mm, and also V/Gc can be controlled easily at a desired value. Therefore, a single crystal including a desired defect region over a whole plane in the radial direction entirely in the direction of the crystal growth axis can be produced at high stability.

In addition, it is preferable that a changing condition that changes a distance between the surface of the raw material melt and the heat insulating member is adjusted among batches for producing the single crystal.

Generally, when production of a single crystal is repeated for plural batches, there is a case that production environment changes among batches for producing the single crystal because of degradation of parts comprising HZ of an apparatus for pulling a single crystal. However, in the present invention, the changing condition that changes the distance between the melt surface and the heat insulating member is adjusted among batches for producing the single crystal, and thus the change of production environment can be compensated. Thereby, even if production of a single crystal is repeated for plural batches, quality does not vary among the batches for production and a single crystal can be produced at high stability.

In these cases, a silicon single crystal is pulled as the single crystal.

As described above, in particular, the method for producing a single crystal according to the present invention is preferably applicable to the case of producing a silicon single crystal. Thereby, a silicon single crystal with high quality including a desired defect region over a whole plane in the radial direction entirely in the direction of the crystal growth axis can be produced effectively for a short time and at high yield.

And, according to the present invention, a single crystal produced by above method for producing a single crystal is provided.

The single crystal produced by the present invention can be a single crystal with very high quality including a desired defect region over a whole plane in the radial direction entirely in the direction of the crystal growth axis, and also having uniform diameters of the crystal. Furthermore, the single crystals of the present invention are provided at lower price than usual because they are produced effectively for a short time and at high yield.

As mentioned above, according to the present invention, when a single crystal is pulled, the temperature gradient Gc at the central portion of the crystal and the temperature gradient Ge at the peripheral portion of the crystal can be controlled by changing the distance between the surface of the raw material melt and the heat insulating member, thereby ΔG can be made 0.5° C./mm or less during pulling the single crystal, and also V/Gc can be controlled with high precision without depending on the pulling rate V. Accordingly, a single crystal with high quality including a desired defect region over a whole plane in the radial direction entirely in the direction of the crystal growth axis can be produced effectively for a short time, and variation of diameters of the single crystal can be reduced. Thereby, productivity and yield for producing a single crystal can be improved and considerable cost reduction can be achieved, and thus the single crystals with very high quality can be provided at low price.

BEST MODE FOR CARRYING OUT THE INVENTION

Figure 1:
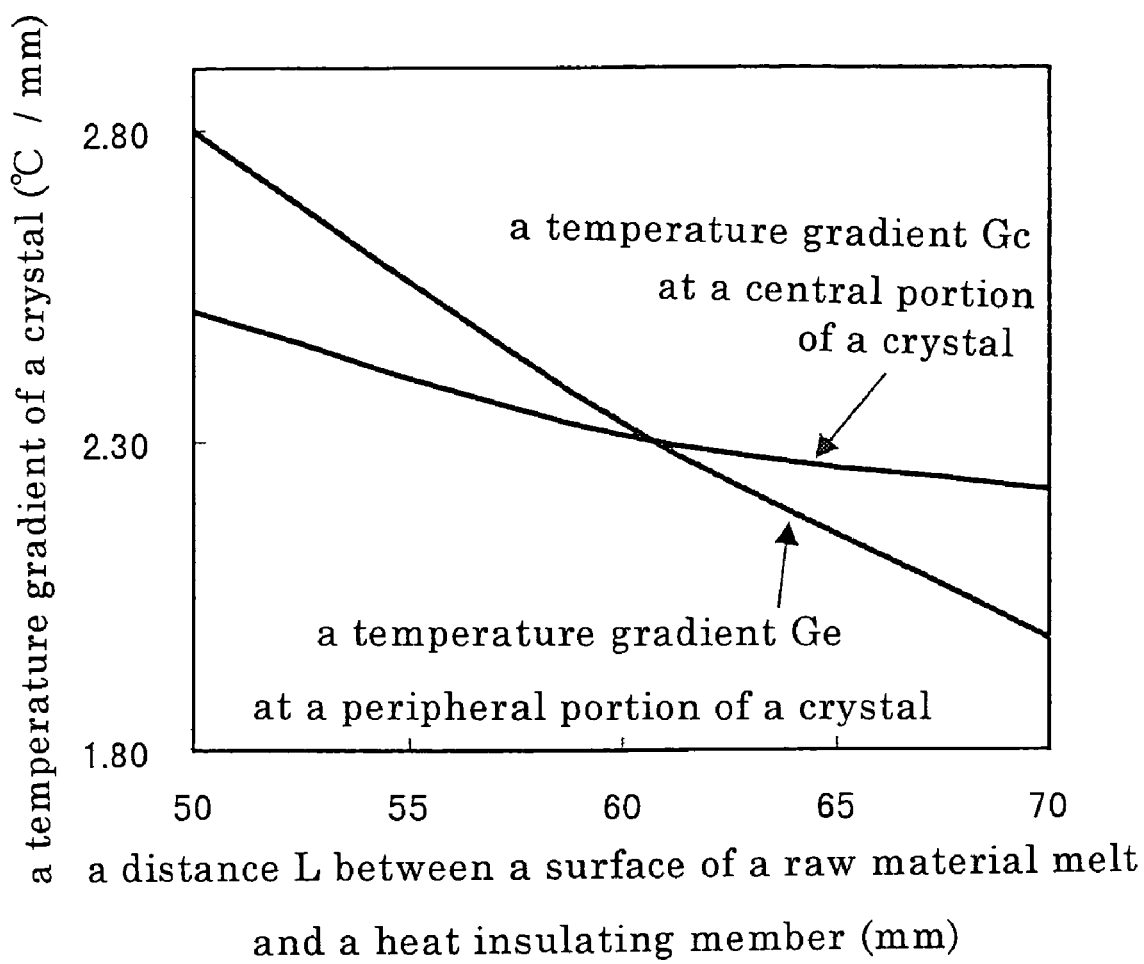
FIG. 1 is a graph showing an example of a relationship between a distance L between a surface of a raw material melt and a heat insulating member and a temperature gradient Gc at a central portion of a crystal, and a relationship between the distance L between the surface of the raw material melt and the heat insulating member and a temperature gradient Ge at a peripheral portion of the crystal.

Hereinafter, embodiments of the present invention will be explained. However, the present invention is not limited thereto.

The present inventors performed thorough experiments and investigations in respect to a method for producing a single crystal including a desired defect region over a whole plane in a radial direction entirely in a direction of the crystal growth axis effectively for a short time. Consequently, they considered that, in order to grow a single crystal of which the whole plane in a radial direction is a desired defect region with stability, it was proper to make difference of a temperature gradient of the crystal over the plane in the radial direction small during growing the single crystal. And they considered that, in order to grow a single crystal including a desired defect region effectively for a short time, it was proper to control V/G by controlling a temperature gradient G of the crystal without lowering a pulling rate. Then, the present inventors gave attention to a distance between a melt surface of a raw material melt and a heat insulating member provided in a chamber so as to oppose to the surface of the raw material melt when pulling a single crystal.

In a conventional growth of a single crystal by CZ method, in order to pull a single crystal including a desired defect region with stability, a pulling rate V was gradually lowered to perform the growth with keeping level of a melt surface of a raw material melt constant by elevating a crucible gradually along with decline of the raw material melt during pulling the single crystal. In addition, because a heat insulating member provided so as to oppose to the surface of the raw material melt was fixed in a chamber of an apparatus for pulling a single crystal, position of the heat insulating member was not changed during growing the single crystal. Therefore, conventionally, the distance between the surface of the raw material melt and the heat insulating member wasn't changed when the single crystal was grown, and rather it was kept constant.

However, the present inventors have found that by changing intentionally the distance between the surface of the raw material melt and the heat insulating member during pulling the single crystal, a temperature gradient Gc of the crystal at a central portion of the crystal and a temperature gradient Ge of the crystal at a peripheral portion of the crystal in a direction of pulling axis from melting point of silicon to 1400° C. at the vicinity of solid-liquid interface can be controlled. Furthermore, they have found that by controlling the temperature gradients Gc and Ge of the crystal, difference $\Delta G$ between the temperature gradient Gc at the central portion of the crystal and the temperature gradient Ge at the peripheral portion of the crystal during pulling the single crystal (Namely, $\Delta G=|(Gc-Ge)|$) can be kept small, and also V/G can be controlled without lowering a pulling rate V during pulling the single crystal.

Here shown in FIG. 1 is an example of a result of simulation analyses using the global heat transfer analysis software FEMAG (F. Dupret, P. Nicodeme, Y. Ryckmans, P. Wouters, and M. J. Crochet, Int. J. Heat Mass Transfer, 33, 1849 (1990)), in the case of changing a distance L between a melt surface of a raw material melt and a heat insulating member provided in a chamber during pulling a single crystal, in respect to fluctuation of a temperature gradient Gc at a central portion of the crystal and a temperature gradient Ge at a peripheral portion of the crystal in the direction of pulling axis. Furthermore shows in FIG. 2, based on the result of FIG. 1, a result of analyses in the case of changing the distance L between the surface of the raw material melt and the heat insulating member during pulling the single crystal in respect to fluctuation of value of (Gc–Ge) which is difference between the temperature gradient Gc at the central portion of the crystal and the temperature gradient Ge at the peripheral portion of the crystal.

Figure 2:
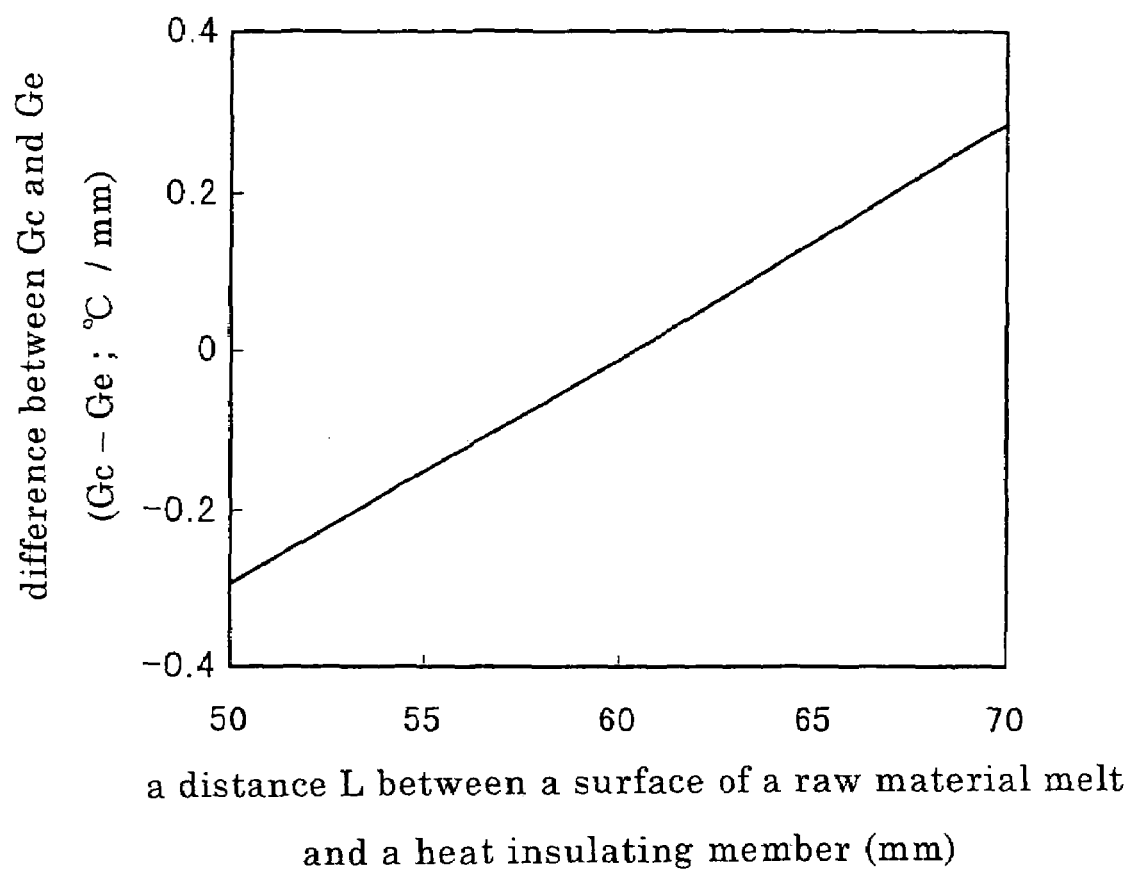
FIG. 2 is a graph showing a relationship between a distance L between a surface of a raw material melt and a heat insulating member and (Gc−Ge) which is difference between a temperature gradients Gc and Ge of the crystal.

As shown in FIGS. 1 and 2, as a result of the simulation analyses, it has been revealed that the temperature gradient Gc at the central portion of the crystal and the temperature gradient Ge at the peripheral portion of the crystal fluctuate by changing the distance L between the surface of the raw material melt and the heat insulating member. For example, if the distance L between the surface of the raw material melt and the heat insulating member is lengthened during pulling the single crystal, the temperature gradients Gc and Ge of the crystal can be made small. On the contrary, if the distance L is shortened, the temperature gradients Gc and Ge of the crystal can be made large. In addition, it has been revealed that because change ratios of the temperature gradients Gc and Ge of the crystal according to the distance L between the surface of the raw material melt and the heat insulating member are different with each other, value of (Gc–Ge) which is difference between Gc and Ge fluctuates according to the distance L.

Moreover, the present inventors performed growth of single crystals in various pulling conditions of the crystal, and investigated a relation between value of $\Delta G$ ($=|(Gc-Ge)|$) during pulling the single crystal and a distribution of a defect region of the grown single crystal. As a result of that, it has been found that, for example, in the case of controlling V/Gc which is a ratio of a pulling rate V and the temperature gradient Gc at the central portion of the crystal during pulling the single crystal so that the single crystal including a desired defect region can be grown, if $\Delta G$ becomes 0.5° C./mm or less, a single crystal of which the whole plane in a radial direction is a desired defect region can be grown with stability.

The present invention is what utilizes the aforementioned each relation between the distance L between the surface of the raw material melt and the heat insulating member and the temperature gradients Gc and Ge of the crystal, and between the distance L and $\Delta G$ during pulling the single crystal.

Namely, the method for producing a single crystal according to the present invention is characterized in that, when a single crystal is grown by CZ method, by changing a distance between a melt surface of a raw material melt and a heat insulating member provided so as to oppose to the surface of the raw material melt, a temperature gradient Gc of the crystal at a central portion in a plane in a radial direction of the single crystal and a temperature gradient Ge of the crystal at a peripheral portion in the plane in the radial direction of the single crystal are controlled to make $\Delta G=|(Gc-Ge)|$ at 0.5° C./mm or less, and also to control V/Gc to be in a desired defect region. In addition, $\Delta G$ in the present invention can be, for example, the difference between the temperature gradient Gc of the crystal at the central portion in the plane in the radial direction of the single crystal and the temperature gradient Ge of the crystal at the position of 5 mm from edge of the peripheral portion to the center in the plane in the radial direction.

Hereinafter, the method for producing a single crystal according to the present invention will be explained in detail with reference to the drawings. However, the present invention is not limited thereto.

Figure 5:
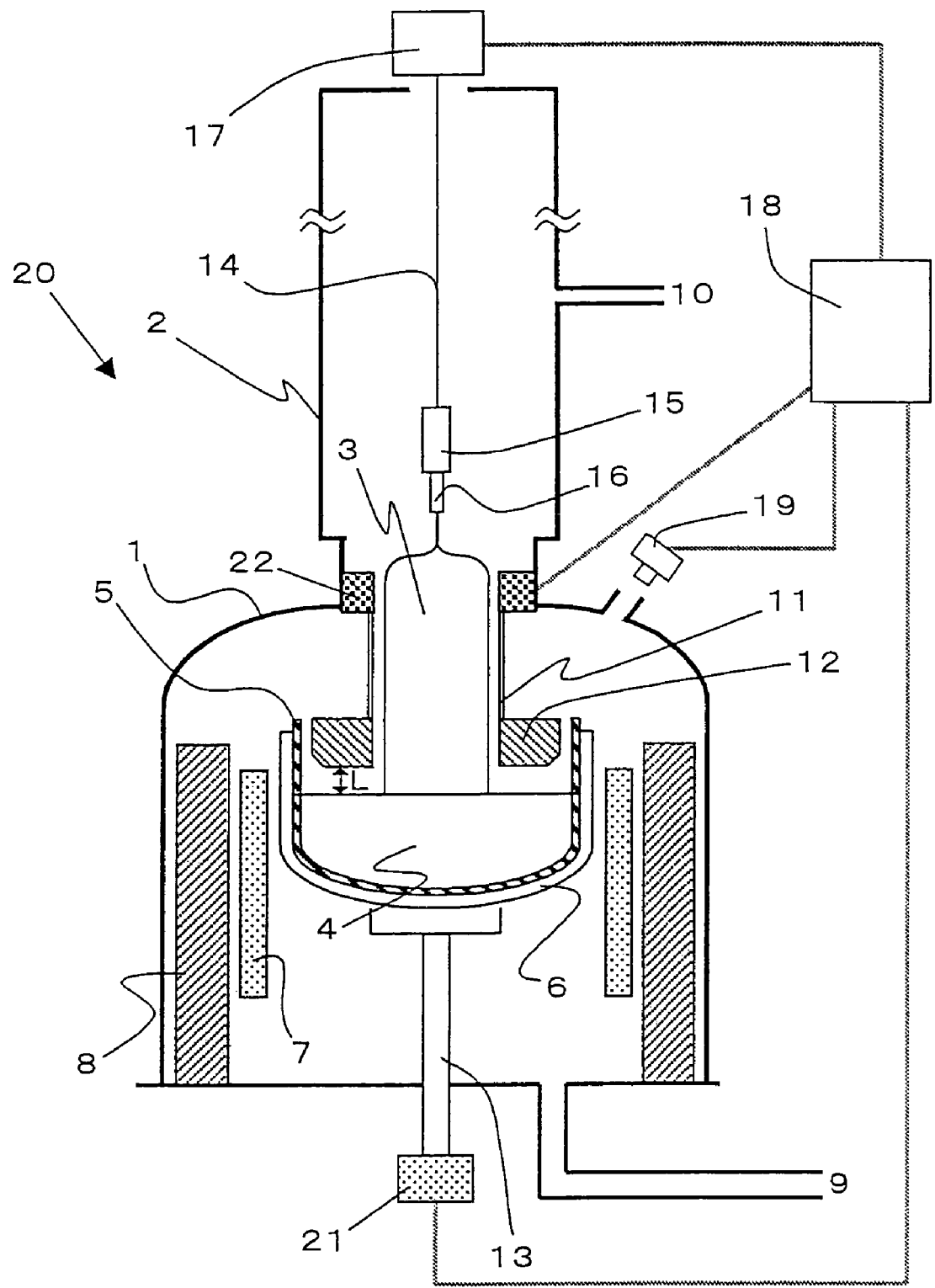
FIG. 5 is a schematic view of a constitution of an example of an apparatus for pulling a single crystal that can be used for carrying out the method for producing a single crystal according to the present invention.

An apparatus for pulling a single crystal used in the method for producing a single crystal according to the present invention is not particularly limited as long as length of a distance L between a melt surface of a raw material melt and a heat insulating member provided in a chamber so as to oppose to the surface of the raw material melt can be changed during pulling a single crystal. However, for example, an apparatus for pulling a single crystal as shown in FIG. 5 can be used. First, with reference to FIG. 5, an apparatus for pulling a single crystal that can be used for carrying out the method for producing a single crystal according to the present invention will be explained.

As for the apparatus 20 for pulling a single crystal as shown in FIG. 5, in a main chamber 1, a quartz crucible 5 for containing a raw material melt 4 therein and a graphite crucible 6 for protecting the quartz crucible 5 are supported by a supporting shaft 13 so that the crucibles can be rotated and moved upwardly or downwardly by a driving mechanism 21 for the crucible. And, a heater 7 and a heat shielding member 8 are provided so as to surround these crucibles 5 and 6. A pulling chamber 2 in which a grown single crystal 3 is stowed and from which the crystal is taken out is continuously provided from the top of the main chamber 1. At the top of the pulling chamber 2, a pulling mechanism 17 for pulling the single crystal 3 with rotating by a wire 14 is provided.

Furthermore, a gas flow-guide cylinder 11 is provided inside the main chamber 1. A heat insulating member 12 is provided at the bottom of the gas flow-guide cylinder 11, so as to oppose to the raw material melt 4 so that the heat radiation from the surface of the raw material melt 4 is intercepted and the temperature of the surface of the raw material melt 4 is kept. In addition, a driving means 22 for the heat insulating member is provided at the top of the gas flow-guide cylinder 11 so that a position of the heat insulating member 12 can be adjusted upwardly or downwardly by moving the gas flow-guide cylinder 11 upwardly or downwardly. And, in the present invention, form, material etc. of the heat insulating member 12 is not particularly limited and they can be changed properly if necessary. Furthermore, the heat insulating member 12 of the present invention is proper as long as it is provided so as to oppose to the melt surface, and the heat insulating member 12 is not necessarily limited to what is provided at the bottom of the gas flow-guide cylinder as shown above.

Further, an inert-gas like an argon gas can be introduced from a gas inlet 10 provided at the upper portion of the pulling chamber 2. The gas passed through between the single crystal 3 being pulled and the gas flow-guide cylinder 11, and passed through between the heat insulating member 12 and the melt surface of the raw material melt 4. And then the gas can be discharged from a gas outlet 9.

In addition, the driving mechanism 21 for the crucible and the driving means 22 for the heat insulating member are connected with a control means 18 for driving. And, for example, data like a position of the crucibles 5 and 6, a position of the heat insulating member 12, a position of the melt surface of the raw material melt 4 monitored by a CCD camera 19, and a pulled length of the single crystal obtained by the pulling mechanism 17, are fed back to the control means 18 for driving, and thus the driving mechanism 21 for the crucible and/or the driving means 22 for the heat insulating member can be adjusted by the control means 18 for driving, for example, according to the pulled length of the single crystal etc., to change the position of the crucibles 5 and 6 and/or the position of the heat insulating member 12. Thereby, a distance L from the melt surface of the raw material melt 4 to the bottom of the heat insulating member 12 can be changed.

For example, when a silicon single crystal is grown by CZ method using such an apparatus 20 for pulling a single crystal, a seed crystal 16 fixed at a seed holder 15 is immersed into the raw material melt 4 in the quartz crucible 5. Then, after the seed crystal 16 is pulled calmly with rotating and a neck portion is formed, with spreading to a desired diameter, the silicon single crystal 3 having a sub-columnar straight body can be grown.

In the present invention, when the silicon single crystal 3 is thus grown, the distance L between the melt surface of the raw material melt 4 in the quartz crucible 5 and the bottom of the heat insulating member 12 is changed, and thus the temperature gradient Gc at the central portion of the crystal and the temperature gradient Ge at the peripheral portion of the crystal in the direction of pulling axis at the vicinity of solid-liquid interface can be controlled. Thereby, difference $\Delta G$ between Gc and Ge is kept at 0.5° C./mm or less during pulling the single crystal, and also V/Gc is controlled with keeping a pulling rate V constant without lowering the pulling rate V. Then, a single crystal including a desired defect region over a whole plane in the radial direction entirely in the direction of the crystal growth axis can be grown effectively for a short time.

Concretely, for example, in the case of growing a silicon single crystal so that a defect region is N region over a whole plane in the radial direction, first when the growth of the straight body of the single crystal begins, a distance L from the surface of the raw material melt to the bottom of the heat insulating member is determined so that the difference $\Delta G$ between the temperature gradient Gc at the central portion of the crystal and the temperature gradient Ge at the peripheral portion of the crystal becomes 0.5° C./mm or less. The distance L between the surface of the raw material melt and the heat insulating member can be adjusted easily by changing positions of the quartz crucible 5 for containing the raw material melt 4 and the graphite crucible 6 with the driving mechanism 21 for the crucible to move a level of the raw material melt up and down and/or by moving the gas flow-guide cylinder 11 with the driving means 22 for the heat insulating member to move a position of the heat insulating member 12 up and down.

At this time, as described above, the distance L between the surface of the raw material melt and the heat insulating member is determined, and a pulling rate V of the crystal during growing the single crystal is also determined according to production environment in which the single crystal is grown (for example, HZ of an apparatus for pulling a single crystal etc.) so that the straight body of the single crystal can be grown to be N region. In this case, the pulling rate V can be determined to be a maximum value in a range in which a single crystal can be grown in N region.

Then, when a straight body of a single crystal is grown with thus-determined pulling rate V, in a region in which the temperature gradient Gc at the central portion of the crystal becomes smaller in the case of pulling the straight body without change, the single crystal is grown so that the distance L between the surface of the raw material melt and the heat insulating member is changed to be shortened, on the contrary in a region in which the temperature gradient Gc at the central portion of the crystal becomes larger, the single crystal is grown so that the distance L is changed to be lengthened, and thus the temperature gradient Gc at the central portion of the crystal and the temperature gradient Ge at the peripheral portion of the crystal can be controlled during pulling the single crystal. Thereby, V/Gc can be controlled at a predetermined value (N region) without depending on the pulling rate V.

At this time, by changing the distance L between the surface of the raw material melt and the heat insulating member, as described above, V/Gc is controlled and also ΔG which is difference between the temperature gradients Gc and Ge of the crystal is always kept at 0.5° C./mm or less. As described above, ΔG is kept at 0.5° C./mm or less and also V/Gc is controlled at a predetermined value during pulling a single crystal, thereby a single crystal in which a desired defect region is distributed uniformly in the direction of the crystal axis and over a whole plane in the radial direction of the crystal can be grown with stability.

In this case, the distance L between the surface of the raw material melt and the heat insulating member during pulling a single crystal can be changed with ease and with high precision, by adjusting an elevation rate of the quartz crucible 5 and the graphite crucible 6 with the driving mechanism 21 for the crucible to be a different rate with compensating the decline of the melt surface caused by growth of the crystal to move the level of the raw material melt upwardly or downwardly in the direction of the crystal growth axis, by moving the gas flow-guide cylinder 11 upwardly or downwardly with the driving means 22 for the heat insulating member to move the position of the heat insulating member 12 upwardly or downwardly, or further by adjusting at the same time the level of the raw material melt and the position of the heat insulating member 12.

Namely, for example, in the case of changing the distance L between the surface of the raw material melt and the heat insulating member to be shortened, the crucibles 5 and 6 can be lifted more than the decline of the melt surface caused by growth of the crystal by raising an elevation rate of the crucible with the driving mechanism 21 for the crucible to raise the level of the raw material melt, and/or the gas flow-guide cylinder 11 can be moved down with the driving means 22 for the heat insulating member to move the position of the heat insulating member 12 downwardly. On the contrary, in the case of changing the distance L to be lengthened, the crucibles 5 and 6 can be lifted less than the decline of the melt surface caused by growth of the crystal with the driving mechanism 21 for the crucible to lower the level of the melt surface, and/or the position of the heat insulating member 12 can be moved upwardly with the driving means 22 for the heat insulating member.

In this case, control range of a distance L between the surface of the raw material melt and the heat insulating member 12 to be changed during pulling the single crystal can be determined properly according to production environment in which the single crystal is practically produced, for example, a structure of HZ, etc. However, in order to make ΔG at 0.5° C./mm or less as described above, it is preferable that the distance L between the surface of the raw material melt and the heat insulating member is at least 30 mm or more. As described above, the distance L between the melt surface and the heat insulating member is made 30 mm or more, thereby radiant heat from the heater can be taken in effectively during pulling the single crystal, and it can become easy to make difference ΔG between the temperature gradient Gc at the central portion of the crystal and the temperature gradient Ge at the peripheral portion of the crystal a small value of 0.5° C./mm or less. Thereby, distribution of crystal defects can be equalized in a radial direction of a crystal.

In addition, maximum of a distance L between the surface of the raw material melt and the heat insulating member can be determined properly according to production environment of a single crystal, a diameter of a single crystal to be grown etc., as long as ΔG can be made 0.5° C./mm or less. However, for example, it is desirable that a distance L between the surface of the raw material melt and the heat insulating member is 300 mm or less, preferably 200 mm or less, more preferably 100 mm or less.

The distance L between the surface of the raw material melt and the heat insulating member is controlled and changed in such control range during pulling the single crystal, thereby ΔG can be easily made 0.5° C./mm or less, and also V/Gc can be controlled at a predetermined value with stability with very high precision. Thereby, a single crystal can be grown with stability so that a desired defect region is distributed over a whole plane in the radial direction entirely in the direction of the crystal growth axis.

As described above, according to the present invention, during pulling a single crystal, the temperature gradient Gc at the central portion of the crystal and the temperature gradient Ge at the peripheral portion of the crystal are controlled by changing a distance L between the surface of the raw material melt and the heat insulating member, thereby ΔG is kept at 0.5° C./mm or less, and also with not lowering the pulling rate V as usual but keeping the pulling rate V a predetermined value or more, especially the maximum pulling rate by which the desired defect region is obtained is kept constant, and V/Gc can be controlled easily so that a single crystal including a desired defect region, for example, N region can be obtained. Naturally, in the present invention, it is not always necessary to keep the pulling rate V constant as long as the temperature gradients Gc and Ge of the crystal are controlled by changing a distance L between a melt surface and a heat insulating member to grow a single crystal to be a desired defect region. However, if the pulling rate is kept constant at the maximum pulling rate by which the desired defect region is obtained as described above, productivity of a single crystal can be considerably improved.

Namely, in the method for producing a single crystal according to the present invention, a single crystal including a desired defect region, for example, N region over a whole plane in the radial direction entirely in the direction of the crystal growth axis can be produced with stability. And an average pulling rate of a crystal can be increased when pulling a straight body of a single crystal, thereby growth of a straight body of a single crystal can be performed in a shorter time than usual. Furthermore, a pulling rate at the end of growing a straight body of a single crystal doesn't become a low rate, and thus pulling time at subsequent tailing process can be reduced. Accordingly, a single crystal with very high quality in which a desired defect region is included over a whole plane in the radial direction entirely in the direction of the crystal growth axis can be produced at high level of productivity and at high stability. In addition, by reducing production time, possibility of generating dislocation in the crystal is reduced, and thus not only productivity but also yield can be improved. As a result of that, quality of a single crystal can be improved and cost can be reduced considerably, thereby a single crystal having an excellent quality with stability can be provided at very low price.

Furthermore, the present invention can resolve an conventional problem in respect to pulling rate of the crystal and control of a diameter of the single crystal as described above. Namely, according to the method for producing a single crystal of the present invention, because V/Gc can be controlled at a predetermined value without depending on a pulling rate V as described above, V/Gc can be controlled with high precision by changing a distance L between the melt surface and the heat insulating member and also an average pulling rate is made, for example, constant, thereby a diameter of a single crystal can be controlled with stability. Accordingly, generation of failure can be prevented by reducing variation of a diameter of a single crystal in a direction of a crystal growth axis, and a single crystal with very high quality including a desired crystal quality and a uniform diameter of a crystal can be produced at high yield.

Figure 6:
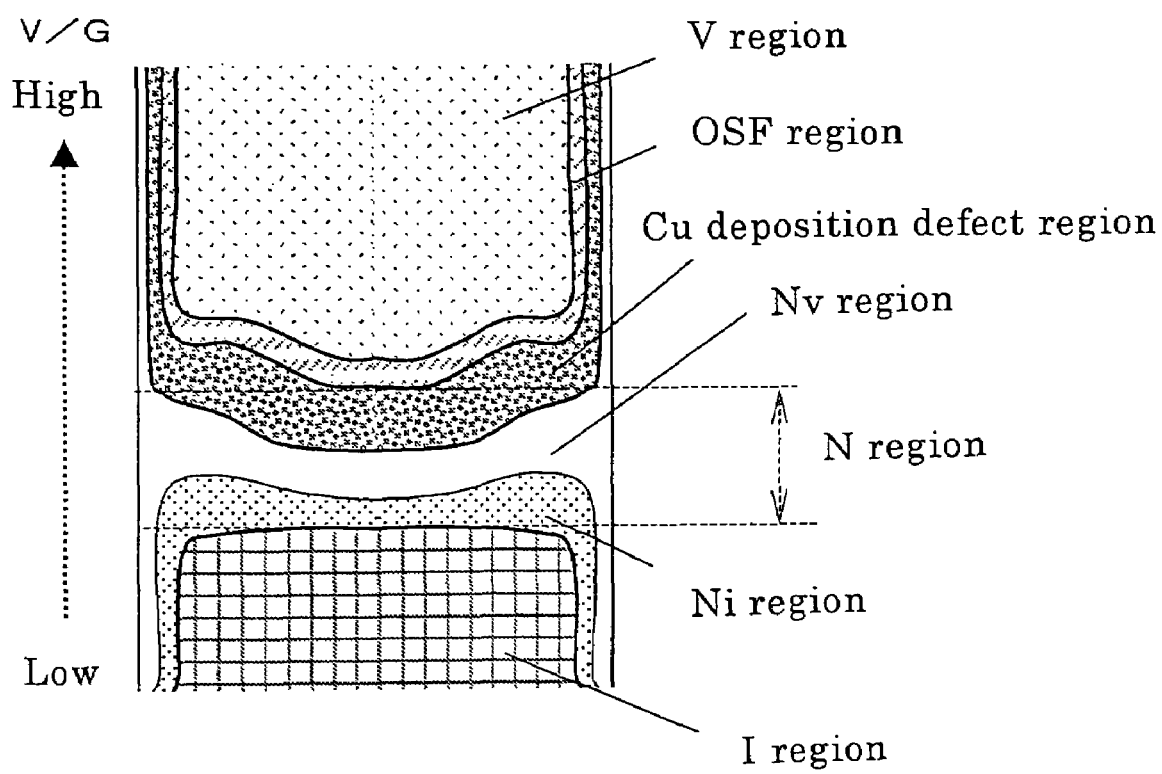
FIG. 6 is an explanatory view showing a relationship between V/G and a distribution of crystal defects.

Furthermore, when a single crystal is grown to be a desired defect region, not by adjusting a pulling rate V but by controlling the temperature gradients Gc and Ge of the crystal according to the present invention, controllability of parameter V/G can be improved. Therefore, a single crystal can be produced with controlling V/Gc with high precision in a narrow region, for example, as shown in FIG. 6, like Nv region or Ni region in N region in which Cu deposition defect region is not included, thereby a single crystal with high quality in which Nv region or Ni region is included over a whole plane in a radial direction entirely in a direction of a crystal growth axis, which was conventionally difficult to be grown, can be obtained at high stability.

In addition, in such a method for producing a single crystal according to the present invention, states of the temperature gradients Gc and Ge of the crystal, each relation between the temperature gradients Gc and Ge of the crystal and a distance L between a melt surface and a heat insulating member etc. in production environment in which the single crystal is produced, is examined beforehand by performing, for example, simulation analysis, experimental measurement, etc. Thereby, changing condition that change the distance L between the melt surface and the heat insulating member can be obtained in detail during pulling a single crystal.

And, thus-obtained changing condition of distance L is input beforehand to a control means 18 for driving shown in FIG. 5, and when pulling a single crystal, data like a position of the crucibles 5 and 6, a position of the heat insulating member 12, a position of the melt surface of the raw material melt 4 monitored by a CCD camera 19, and a pulled length of the single crystal obtained by the pulling mechanism 17, are fed back to the control means 18 for driving, and thus a position of the crucibles 5 and 6 and/or a position of the heat insulating member 12 can be changed by adjusting the driving mechanism 21 for the crucible and/or the driving means 22 for the heat insulating member by the control means 18 for driving according to the changing condition. Thereby, a distance L between the surface of the raw material melt and the heat insulating member is changed automatically according to the pulled length of the single crystal etc., and thus the temperature gradients Gc and Ge of the crystal can be controlled with high precision. Accordingly, during pulling a single crystal, $\Delta G$ can be surely made 0.5° C./mm or less, and also V/Gc can be controlled automatically with high precision, thereby a single crystal including a desired defect region over a whole plane in a radial direction can be produced easily and at high stability.

Furthermore, in the method for producing a single crystal according to the present invention, in the case of producing single crystals by CZ method in plural batches successively, it is preferable that a changing condition that changes a distance L between surface of a raw material melt and a heat insulating member is adjusted among batches for producing a single crystal.

Generally, when production of a single crystal is repeated for plural batches, there is a case that production environment like HZ changes among batches for producing the single crystal by a cause like degradation of parts comprising HZ of an apparatus for pulling a single crystal. Especially, many parts made of graphite are used as parts of HZ. Among them, a heater is mostly a graphite heater, and temperature distribution changes gradually as it is used. And when production environment changes among batches for producing the single crystal as described above, both of the temperature gradient Gc at the central portion of the crystal and the temperature gradient Ge at the peripheral portion of the crystal change among batches for producing the single crystal.

Accordingly, in the case of producing single crystals for plural batches, if the changing condition of a distance L between the surface of the raw material melt and the heat insulating member is adjusted among batches for producing the single crystal according to change of production environment etc. as described above, change of production environment can be compensated, and thus a single crystal with high quality can be produced at high stability without generating dispersed quality among batches for production. Concretely, a relation between a distance L between the melt surface and the heat insulating member and defect distribution in last batch is fed back, and production conditions on and after next batch can be adjusted.

Hereinafter, the present invention will be explained further in detail with reference to Example and Comparative Example, however, the present invention is not limited thereto.

EXAMPLE

Using an apparatus 20 for pulling a single crystal as shown in FIG. 5, 150 kg of polycrystalline silicon as a raw material was charged with a quartz crucible with a diameter of 24 inches (600 mm), and a silicon single crystal with orientation of <100>, a diameter of 200 mm, and oxygen concentration in the range of 22-23 ppma (ASTM' 79 value) was grown by CZ method. (The length of the straight body of the single crystal was around 120 cm.)

At this time, as to pulling condition during pulling the single crystal, a temperature gradient Gc at the central portion of the crystal and a temperature gradient Ge at the peripheral portion of the crystal were examined by performing simulation analysis beforehand. Then, based on the result of the analysis, the pulling condition was controlled so that a distance L between the melt surface of the raw material melt 4 and the heat insulating member 12 and a pulling rate become values shown in below table 1 during pulling a single crystal, with making $\Delta G$ at 0.5° C./mm or less, and the single crystal was grown to be N region in which no Cu deposition defect region was detected. Concretely, the heat insulating member 12 was supported at the prescribed position in the main chamber 1, and the level of the raw material melt was moved up and down according to the pulled length of the single crystal by adjusting an elevation rate of the crucibles 5 and 6 with the driving mechanism 21 for the crucible in consideration of decline of the melt surface during pulling the single crystal, thereby the distance L between the melt surface and the heat insulating member was made values shown in the table 1. In addition, the pulling rate of the single crystal was controlled to be constant at 0.56 mm/min on and after pulling 10 cm of the straight body of the single crystal. And, the pulling rate was high at pulling 0 cm of the straight body because so-called a shoulder portion was pulled by which the growth was transferred from the portion of spreading diameter to the straight body. The shoulder portion is formed and then the growth is transferred to pulling the straight body. Then, the pulling rate can be stabilized while pulling 10 cm or less.

TABLE 1

| a length of the grown straight body(cm) | a distance L between the surface of the raw material melt and the heat insulating member (mm) | a pulling rate (mm/min) | Δ G (※) (° C./mm) |
|---|---|---|---|
| 0 | 60.0 | 1.200 | — |
| 10 | 60.0 | 0.560 | 0.01 |
| 20 | 58.8 | 0.560 | 0.01 |
| 30 | 56.3 | 0.560 | 0.01 |
| 40 | 57.5 | 0.560 | 0.01 |
| 50 | 58.8 | 0.560 | 0.01 |
| 60 | 60.0 | 0.560 | 0.01 |
| 70 | 60.0 | 0.560 | 0.01 |
| 80 | 60.0 | 0.560 | 0.01 |
| 90 | 60.0 | 0.560 | 0.01 |
| 100 | 58.8 | 0.560 | 0.01 |
| 110 | 57.5 | 0.560 | 0.01 |
| 120 | 56.3 | 0.560 | 0.01 |

(※) Δ G = Ge − Gc

Next, test wafers were cut from above-grown single crystal at intervals of 10 cm in the direction of the crystal growth axis, and the wafers were subjected to surface grinding and polishing to produce test samples. Then, the test samples were tested in respect to crystal quality characteristics as shown below.

(1) A Test of FPD (V Region) and LSEPD (I Region)

The test samples were subjected to Secco etching for 30 minutes without stirring. Then, the plane of the wafer was observed with a microscope, and it was ascertained whether there were crystal defects.

(2) A Test of OSF

The test samples were subjected to a heat treatment at a temperature of 1100° C. for 100 minutes under a wet oxygen atmosphere. Then, the plane of the wafer was observed with a microscope, and it was ascertained whether there were OSFs.

(3) A Test of Defect by Cu Deposition Treatment

An oxide film was formed on each surface of the test samples. Then, the test samples were subjected to Cu deposition treatment, and it was observed whether oxide-film defects were existed. Evaluation conditions at that time were as follows:

oxide film: 25 nm, intensity of electric field: 6 MV/cm, time of impressed voltage: 5 minutes.

(4) A Test of Oxide Dielectric Breakdown Voltage Characteristics

The test samples were subjected to a thermal oxidation treatment under a dry atmosphere. Thereby a gate oxide film with a thickness of 25 nm was formed, and on which a polysilicon electrode having an electrode area of 8 mm$^2$ and doped with phosphorous was formed. Then, voltage was applied to the polysilicon electrode formed on the oxide film to evaluate oxide dielectric breakdown voltage. At this time, current density in decision was 1 mA/cm$^2$.

COMPARATIVE EXAMPLE

Using the same apparatus 20 for pulling a single crystal as above Example, 150 kg of polycrystalline silicon as a raw material was charged with a quartz crucible with a diameter of 24 inches (600 mm), and a silicon single crystal with orientation of <100>, a diameter of 200 mm, and oxygen concentration in the range of 22-23 ppma (ASTM' 79 value) was grown by CZ method. (The length of the straight body of the single crystal was around 120 cm.)

At this time, as to pulling condition during pulling the single crystal, the heat insulating member 12 was supported at the prescribed position in the main chamber 1, and the level of the melt surface of the raw material melt 4 was kept constant by lifting the crucibles 5 and 6 with the driving mechanism 21 for the crucible to compensate decline of the melt surface caused by the growth of the crystal, thereby the distance L between the melt surface and the heat insulating member was always kept constant at 60 mm during pulling the single crystal. In addition, the pulling rate was controlled at values shown in below table 2 during growing the single crystal, and the single crystal was grown to be N region in which no Cu deposition defect region was detected.

Then, the test wafers were cut from the obtained single crystal at intervals of 10 cm in the direction of the crystal growth axis, and the wafers were subjected to surface grinding and polishing to produce test samples. Then, the test samples were tested in respect to crystal quality characteristics as was the case with Example.

TABLE 2

| a length of the grown straight body(cm) | a distance L between the surface of the raw material melt and the heat insulating member (mm) | a pulling rate (mm/min) | Δ G (※) (° C./mm) |
|---|---|---|---|
| 0 | 60.0 | 1.200 | — |
| 10 | 60.0 | 0.550 | −0.34 |
| 20 | 60.0 | 0.545 | −0.42 |
| 30 | 60.0 | 0.535 | −0.60 |
| 40 | 60.0 | 0.540 | −0.52 |
| 50 | 60.0 | 0.545 | −0.42 |
| 60 | 60.0 | 0.550 | −0.34 |
| 70 | 60.0 | 0.550 | −0.34 |
| 80 | 60.0 | 0.550 | −0.34 |
| 90 | 60.0 | 0.550 | −0.34 |
| 100 | 60.0 | 0.545 | −0.42 |
| 110 | 60.0 | 0.540 | −0.52 |
| 120 | 60.0 | 0.535 | −0.60 |

(※) Δ G = Ge − Gc

Figure 3:
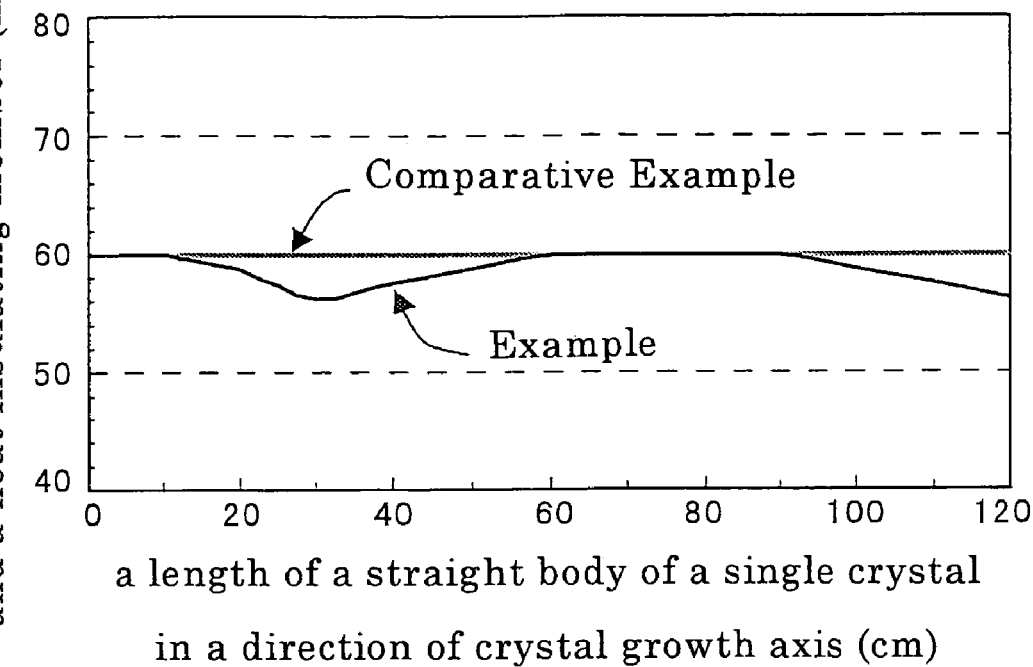
FIG. 3 is a graph showing a relationship between a length of a straight body of a single crystal in a direction of crystal growth axis and a distance L between a surface of a raw material melt and a heat insulating member when the single crystals are grown in Example and Comparative Example.
Figure 4:
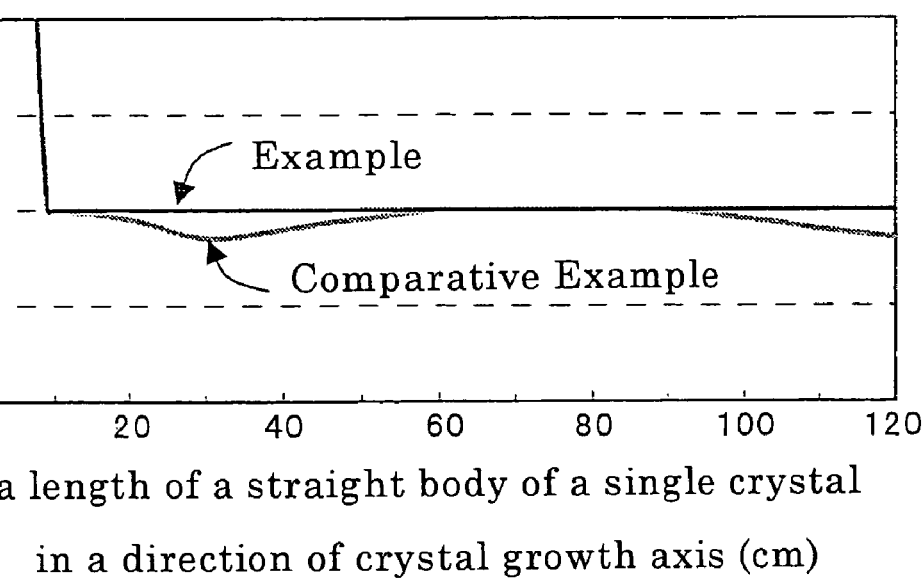
FIG. 4 is a graph showing a relationship between a length of a straight body of a single crystal in a direction of crystal growth axis and a pulling rate when the single crystals are grown in Example and Comparative Example.

Here, in order to compare the pulling conditions of single crystals in Example and Comparative Example, in FIG. 3, a graph showing a relationship between a length of the straight body of the single crystal in the direction of the crystal growth axis and a distance L between the surface of the raw material melt and the heat insulating member is denoted. Furthermore, in FIG. 4, a graph showing a relationship between a length of the straight body in the direction of the crystal growth axis and a pulling rate is denoted. Moreover, average pulling rates on and after pulling 10 cm of the straight body when the straight body of the single crystals were grown in Example and Comparative Example were calculated and compared, the average pulling rate in Example is larger by around 0.015 mm/min than that in Comparative Example.

As a result of performing tests of crystal quality characteristics in respect to the respective silicon single crystals produced in above Example and Comparative Example, none of the defects of FPD, LSEPD and OSF were detected and no defects detected by Cu deposition treatment were observed from 10 cm to the end of the straight body of the single crystal of Example. However, LSEPD (I region) was observed in a portion of the sample produced from the position of 100 cm of the straight body of the silicon single crystal in Comparative Example. Meanwhile, as to evaluation of oxide dielectric breakdown voltage characteristics, level of oxide dielectric breakdown voltage was 100% good chip yield in both of the silicon single crystals.

In addition, shapes of the straight body of the single crystals were observed visually when silicon single crystals were grown in Example and Comparative Example, variation of diameter wasn't seen in the direction of the crystal growth axis and no failure respect was observed in the silicon single crystal of Example. However, deformation of crystal shape was seen in the region of 25 cm of the straight body of the silicon single crystal in Comparative Example.

According to the above result, it has been found that in Example in which the pulling rate is kept constant to grow the single crystal, the silicon single crystal of which crystal quality is more excellent can be produced effectively in a shorter time than Comparative Example. In addition, as to yield, it has been confirmed that yield which is equal or higher than Comparative Example can be achieved because no failure respect was observed in the silicon single crystal of Example.

In addition, the present invention is not limited to the embodiment described above. The above embodiment is mere an example, and those having substantially the same structure as technical ideas described in the appended claims and providing the similar functions and advantages are included in the scope of the present invention.

For example, above embodiment was explained in the case of growing a single crystal of N region. However, the present invention is not limited thereto, and a single crystal of a desired defect region like V region, I region or OSF region can be produced. Furthermore, although the present invention is preferably applicable to the case of producing a silicon single crystal, the present invention is not limited thereto, and the present invention is also applicable to produce a single crystal of compound semiconductor etc.

In addition, the method for producing a single crystal according to the present invention is not necessary limited to be carried out over the whole length of the straight body of the single crystal. The present invention includes the case that the temperature gradients Gc and Ge of the crystal are controlled over a portion of length by changing a distance between a surface of a raw material melt and a heat insulating member to obtain a desired defect region. As described above, especially, there is a case that a pulling rate or a diameter is not stabilized in the region of 10 cm from the shoulder portion, which is the former half of the straight body. Therefore, it is preferable that the present invention is carried out after pulling 5 cm or 10 cm of the straight body in which the pulling rate or the diameter can become steady with ease.

The invention claimed is:

1. A method for producing a single crystal with pulling the single crystal from a raw material melt in a chamber by Czochralski method, wherein when growing the single crystal, where a pulling rate is defined as V (mm/min), a temperature gradient of the crystal at the vicinity of solid-liquid interface at a central portion of the crystal is defined as Gc (° C./mm), and a temperature gradient of the crystal at the vicinity of solid-liquid interface at a peripheral portion of the crystal is defined as Ge (° C./mm) during growing a straight body of the single crystal, during pulling the single crystal, the temperature gradient Gc of the crystal at the central portion of the crystal and the temperature gradient Ge of the crystal at the peripheral portion of the crystal are controlled by changing a distance between a melt surface of the raw material melt and a heat insulating member provided in the chamber so as to oppose to the surface of the raw material melt, thereby $\Delta G=|(Gc-Ge)|$ which is difference between the temperature gradient Gc at the central portion of the crystal and the temperature gradient Ge at the peripheral portion of the crystal is 0.5° C./mm or less, and also V/Gc (mm²/° C.·min) which is a ratio of the pulling rate V and the temperature gradient Gc at the central portion of the crystal is controlled so that a single crystal including a desired defect region is grown.

2. The method for producing a single crystal according to claim 1, wherein the single crystal is pulled with keeping the pulling rate V constant.

3. The method for producing a single crystal according to claim 2, wherein V/Gc is controlled so that the defect region of the single crystal to be grown is N region over a whole plane in a radial direction.

4. The method for producing a single crystal according to claim 3, wherein the distance between the surface of the raw material melt and the heat insulating member is changed by adjusting an elevation rate of a crucible containing the raw material melt to move a level of the raw material melt up and down and/or by moving a position of the heat insulating member up and down.

5. The method for producing a single crystal according to claim 4, wherein the distance between the surface of the raw material melt and the heat insulating member is 30 mm or more.

6. The method for producing a single crystal according to claim 4, wherein the distance between the surface of the raw material melt and the heat insulating member is changed automatically according to a changing condition obtained by performing an experiment beforehand.

7. The method for producing a single crystal according to claim 4, wherein a changing condition that changes the distance between the surface of the raw material melt and the heat insulating member is adjusted among batches for producing the single crystal.

8. The method for producing a single crystal according to claim 4, wherein a silicon single crystal is pulled as the single crystal.

9. The method for producing a single crystal according to claim 3, wherein the distance between the surface of the raw material melt and the heat insulating member is 30 mm or more.

10. The method for producing a single crystal according to claim 3, wherein the distance between the surface of the raw material melt and the heat insulating member is changed automatically according to a changing condition obtained by performing an experiment beforehand.

11. The method for producing a single crystal according to claim 3, wherein a changing condition that changes the distance between the surface of the raw material melt and the heat insulating member is adjusted among batches for producing the single crystal.

12. The method for producing a single crystal according to claim 3, wherein a silicon single crystal is pulled as the single crystal.

13. The method for producing a single crystal according to claim 2, wherein the distance between the surface of the raw material melt and the heat insulating member is changed by adjusting an elevation rate of a crucible containing the raw material melt to move a level of the raw material melt up and down and/or by moving a position of the heat insulating member up and down.

14. The method for producing a single crystal according to claim 13, wherein the distance between the surface of the raw material melt and the heat insulating member is 30 mm or more.

15. The method for producing a single crystal according to claim 13, wherein the distance between the surface of the raw material melt and the heat insulating member is changed automatically according to a changing condition obtained by performing an experiment beforehand.

16. The method for producing a single crystal according to claim 13, wherein a changing condition that changes the distance between the surface of the raw material melt and the heat insulating member is adjusted among batches for producing the single crystal.

17. The method for producing a single crystal according to claim 13, wherein a silicon single crystal is pulled as the single crystal.

18. The method for producing a single crystal according to claim 2, wherein the distance between the surface of the raw material melt and the heat insulating member is 30 mm or more.

19. The method for producing a single crystal according to claim 2, wherein the distance between the surface of the raw material melt and the heat insulating member is changed automatically according to a changing condition obtained by performing an experiment beforehand.

20. The method for producing a single crystal according to claim 2, wherein a changing condition that changes the distance between the surface of the raw material melt and the heat insulating member is adjusted among batches for producing the single crystal.

21. The method for producing a single crystal according to claim 2, wherein a silicon single crystal is pulled as the single crystal.

22. The method for producing a single crystal according to claim 1, wherein V/Gc is controlled so that the defect region of the single crystal to be grown is N region over a whole plane in a radial direction.

23. The method for producing a single crystal according to claim 22, wherein the distance between the surface of the raw material melt and the heat insulating member is changed by adjusting an elevation rate of a crucible containing the raw material melt to move a level of the raw material melt up and down and/or by moving a position of the heat insulating member up and down.

24. The method for producing a single crystal according to claim 23, wherein the distance between the surface of the raw material melt and the heat insulating member is 30 mm or more.

25. The method for producing a single crystal according to claim 23, wherein the distance between the surface of the raw material melt and the heat insulating member is changed automatically according to a changing condition obtained by performing an experiment beforehand.

26. The method for producing a single crystal according to claim 23, wherein a changing condition that changes the distance between the surface of the raw material melt and the heat insulating member is adjusted among batches for producing the single crystal.

27. The method for producing a single crystal according to claim 23, wherein a silicon single crystal is pulled as the single crystal.

28. The method for producing a single crystal according to claim 22, wherein the distance between the surface of the raw material melt and the heat insulating member is 30 mm or more.

29. The method for producing a single crystal according to claim 22, wherein the distance between the surface of the raw material melt and the heat insulating member is changed automatically according to a changing condition obtained by performing an experiment beforehand.

30. The method for producing a single crystal according to claim 22, wherein a changing condition that changes the distance between the surface of the raw material melt and the heat insulating member is adjusted among batches for producing the single crystal.

31. The method for producing a single crystal according to claim 22, wherein a silicon single crystal is pulled as the single crystal.

32. The method for producing a single crystal according to claim 1, wherein the distance between the surface of the raw material melt and the heat insulating member is changed by adjusting an elevation rate of a crucible containing the raw material melt to move a level of the raw material melt up and down and/or by moving a position of the heat insulating member up and down.

33. The method for producing a single crystal according to claim 32, wherein the distance between the surface of the raw material melt and the heat insulating member is 30 mm or more.

34. The method for producing a single crystal according to claim 32, wherein the distance between the surface of the raw material melt and the heat insulating member is changed automatically according to a changing condition obtained by performing an experiment beforehand.

35. The method for producing a single crystal according to claim 32, wherein a changing condition that changes the distance between the surface of the raw material melt and the heat insulating member is adjusted among batches for producing the single crystal.

36. The method for producing a single crystal according to claim 32, wherein a silicon single crystal is pulled as the single crystal.

37. The method for producing a single crystal according to claim 1, wherein the distance between the surface of the raw material melt and the heat insulating member is 30 mm or more.

38. The method for producing a single crystal according to claim 1, wherein the distance between the surface of the raw material melt and the heat insulating member is changed automatically according to a changing condition obtained by performing an experiment beforehand.

39. The method for producing a single crystal according to claim 1, wherein a changing condition that changes the distance between the surface of the raw material melt and the heat insulating member is adjusted among batches for producing the single crystal.

40. The method for producing a single crystal according to claim 1, wherein a silicon single crystal is pulled as the single crystal.

* * * * *